(12) United States Patent
Herron et al.

(10) Patent No.: US 7,231,621 B1
(45) Date of Patent: Jun. 12, 2007

(54) SPEED VERIFICATION OF AN EMBEDDED PROCESSOR IN A PROGRAMMABLE LOGIC DEVICE

(75) Inventors: Nigel G. Herron, San Jose, CA (US); Ahmad R. Ansari, San Jose, CA (US); Stephen M. Douglass, Saratoga, CA (US); Anthony Correale, Jr., Raleigh, NC (US); Leslie M. DeBruyne, Cary, NC (US)

(73) Assignees: Xilinx, Inc., San Jose, CA (US); International Business Machines, Armonk, NY (US)

( * ) Notice: Subject to any disclaimer, the term of this patent is extended or adjusted under 35 U.S.C. 154(b) by 313 days.

(21) Appl. No.: 10/837,395

(22) Filed: Apr. 30, 2004

(51) Int. Cl.
  *G06F 9/45* (2006.01)
  *G01R 31/28* (2006.01)
(52) U.S. Cl. .................. 716/6; 716/2; 716/4; 716/5; 714/726; 714/732; 714/733
(58) Field of Classification Search .................. 716/2, 716/4–6, 8, 16, 19, 21; 717/114; 714/5, 714/39, 718, 724, 725, 726, 733, 797; 713/300; 703/14; 327/31, 141; 257/48
See application file for complete search history.

(56) References Cited

U.S. PATENT DOCUMENTS

| | | | |
|---|---|---|---|
| 3,761,695 A | 9/1973 | Eichelberger | |
| 4,687,988 A | 8/1987 | Eichelberger et al. | |
| 4,880,754 A | 11/1989 | Correale | |
| 5,307,478 A | 4/1994 | Rasbold et al. | |
| 5,719,783 A | 2/1998 | Kerzman et al. | |
| 5,724,250 A | 3/1998 | Kerzman et al. | |
| 5,748,497 A | 5/1998 | Scott et al. | |
| 5,761,515 A | 6/1998 | Barton, III et al. | |
| 5,819,072 A | 10/1998 | Bushard et al. | |
| 5,852,712 A * | 12/1998 | Allen et al. ..................... 714/5 |
| 5,889,788 A * | 3/1999 | Pressly et al. .............. 714/726 |
| 5,923,564 A | 7/1999 | Jones, Jr. | |
| 5,963,566 A | 10/1999 | Rajsuman et al. | |
| 6,035,407 A * | 3/2000 | Gebara et al. .............. 713/300 |
| 6,059,451 A | 5/2000 | Scott et al. | |
| 6,071,003 A * | 6/2000 | Ashuri et al. .................. 716/6 |
| 6,133,582 A * | 10/2000 | Osann et al. ................. 257/48 |
| 6,154,872 A * | 11/2000 | Jones ......................... 714/797 |
| 6,163,875 A | 12/2000 | Suzuki | |

(Continued)

OTHER PUBLICATIONS

Xilinx, Inc.; "Virtex-II Prox X Platform FPGAs: Functional Description"; DS110-2 (v1.1); Advance Product Specification; Mar. 5, 2004; available from Xilinx, Inc., 2100 Logic Drive, San Jose, California 95124; pp. 1-51.

(Continued)

*Primary Examiner*—Vuthe Siek
*Assistant Examiner*—Helen Rossoshek
(74) *Attorney, Agent, or Firm*—W. Eric Webostad

(57) ABSTRACT

Method and apparatus for generating a test program for a programmable logic device having an embedded processor. Predetermined code is obtained to exercise at least one speed limiting path identified. To the predetermined code is added wrapper code to provide the test program, the wrapper code in part for loading the predetermined code into cache of the embedded processor for testing the at least one speed limiting path of the embedded processor identified.

23 Claims, 7 Drawing Sheets

U.S. PATENT DOCUMENTS

| | | | |
|---|---|---|---|
| 6,185,714 | B1 | 2/2001 | Satoh |
| 6,212,666 | B1 | 4/2001 | Gohl et al. |
| 6,249,893 | B1 | 6/2001 | Rajsuman et al. |
| 6,314,540 | B1 | 11/2001 | Huott et al. |
| 6,363,520 | B1 | 3/2002 | Boubezari et al. |
| 6,408,412 | B1 | 6/2002 | Rajsuman |
| 6,415,403 | B1 | 7/2002 | Huang et al. |
| 6,424,583 | B1 | 7/2002 | Sung et al. |
| 6,427,224 | B1 * | 7/2002 | Devins et al. ............... 716/4 |
| 6,513,103 | B1 | 1/2003 | Garlepp et al. |
| 6,532,571 | B1 | 3/2003 | Gabrielson et al. |
| 6,609,228 | B1 | 8/2003 | Bergeron et al. |
| 6,657,635 | B1 * | 12/2003 | Hutchins et al. ............ 345/543 |
| 6,658,506 | B1 | 12/2003 | Nassif et al. |
| 6,658,610 | B1 | 12/2003 | Chai et al. |
| 6,658,633 | B2 | 12/2003 | Devins et al. |
| 6,817,006 | B1 * | 11/2004 | Wells et al. ................. 716/16 |
| 6,826,717 | B1 * | 11/2004 | Draper et al. ................ 714/39 |
| 6,839,874 | B1 | 1/2005 | Fang |
| 6,874,108 | B1 * | 3/2005 | Abramovici et al. ........ 714/725 |
| 6,891,410 | B2 * | 5/2005 | Sadowski .................... 327/141 |
| 6,934,922 | B1 | 8/2005 | Burnley |
| 6,973,636 | B2 * | 12/2005 | Shin et al. .................... 716/19 |
| 6,983,405 | B1 | 1/2006 | Herron et al. |
| 7,007,251 | B2 * | 2/2006 | Hekmatpour .................. 716/4 |
| 7,017,094 | B2 * | 3/2006 | Correale et al. ............ 714/733 |
| 7,062,744 | B2 * | 6/2006 | Osann ........................ 716/16 |
| 7,080,300 | B1 | 7/2006 | Herron et al. |
| 7,092,865 | B1 | 8/2006 | Burnley et al. |
| 2002/0075740 | A1 | 6/2002 | Sung et al. |
| 2003/0105617 | A1 * | 6/2003 | Cadambi et al. ............ 703/14 |
| 2003/0167144 | A1 * | 9/2003 | Wang et al. ................ 702/119 |
| 2003/0177455 | A1 | 9/2003 | Kaufman et al. |
| 2004/0006584 | A1 * | 1/2004 | Vandeweerd ............... 709/107 |
| 2004/0025129 | A1 | 2/2004 | Batchelor |
| 2004/0027462 | A1 * | 2/2004 | Hing ........................ 348/222.1 |
| 2004/0030861 | A1 * | 2/2004 | Plackle et al. ................ 712/32 |
| 2004/0040005 | A1 * | 2/2004 | Carison ........................ 716/8 |
| 2004/0061541 | A1 | 4/2004 | Correale et al. |
| 2004/0062360 | A1 | 4/2004 | Holeva |
| 2004/0064771 | A1 | 4/2004 | Appinger et al. |
| 2004/0064794 | A1 | 4/2004 | Yang |
| 2004/0133830 | A1 * | 7/2004 | Lee ............................ 714/724 |
| 2004/0151209 | A1 * | 8/2004 | Cummings et al. ......... 370/503 |
| 2004/0216061 | A1 * | 10/2004 | Floyd et al. .................... 716/4 |
| 2005/0102594 | A1 * | 5/2005 | Dey et al. .................... 714/733 |
| 2005/0154552 | A1 * | 7/2005 | Stroud et al. ............... 702/120 |
| 2005/0160402 | A1 * | 7/2005 | Wang et al. ................ 717/114 |
| 2005/0188230 | A1 * | 8/2005 | Bilak ........................ 713/300 |
| 2005/0278680 | A1 * | 12/2005 | Mukherjee .................... 716/16 |
| 2006/0119397 | A1 * | 6/2006 | Ferraiolo et al. ............. 327/31 |

OTHER PUBLICATIONS

Xilinx, Inc.; "Processor Local Bus (PLB) Arbiter Design Specification"; Virtex-II Pro IP Handbook; Feb. 27, 2002; available from Xilinx, Inc., 2100 Logic Drive, San Jose, California 95124; pp. 35-70.

Xilinx, Inc.; "PLB Block RAM (BRAM) Interface Controller"; DS420 (v1.2); Product Specification; Nov. 11, 2002; available from Xilinx, Inc., 2100 Logic Drive, San Jose, California 95124; pp. 525-534.

Marion G. Harman et al.; "A Retargetable Technique for Predicting Execution Time of Code Segments"; This work was supported in part by grants from the U.S. Office of Nayal Research; pp. 1-30. Best available date for the examination purpose is the date of filing instant IDS is Aug. 11, 2004.

Jay Lawrence; "Orthogonality of Verilog Data Types and Object Kinds"; Cadence Design Systems; Copublished by the IEEE CS and the IEEE CASS; IEEE Design and Test of Computers; Copyright 2003 IEEE, pp. 94-96.

Interview; "ARM Twisting with Sir Robin, An Interview with ARM Chairman Sir Robin Saxby"; Copyright 2003 IEEE; Copublished by the IEEE CS and the IEEE CASS; IEEE Design and Test of Computers; pp. 90-93.

Peter C. Maxwell; "Wafer-Package Test Mix for Optimal Defect Detection and Test Time Savings"; Agilent Technologies; Copyright 2003; Copublished by the IEEE CS and the IEEE CASS; IEEE Design and Test of Computers; pp. 84-89.

Bill Eklow (Cisco Systems), Carl Barnhart (Cadence), Kenneth P. Parker (Agilent Technologies); "IEEE 1149.6: A Boundary-Scan Standard for Advanced Digital Networks"; Copyright 2003; Copublished by the IEEE CS and the IEEE CASS; IEEE Design and Test of Computers; pp. 76-83.

Darren Anand et al.; "An On-Chip Self-Repair Calculation and Fusing Methodology"; Copyright 2003; Copublished by the IEEE CS and the IEEE CASS; IEEE Design and Test of Computers; pp. 67-75.

Jansuz Rajski et al.; "Embedded Deterministic Test for Low-Cost Manufacturing"; Copyright 2003; Copublished by the IEEE CS and the IEEE CASS; IEEE Design and Test of Computers; pp. 58-66.

Robert Madge et al.; "Obtaining High Defect Coverage for Frequency-Dependent Defects in Complex ASICs"; Copyright 2003; Copublished by the IEEE CS and the IEEE CASS; IEEE Design and Test of Computers; pp. 46-53.

Bruce D. Cory et al.; "Speed Binning with Path Delay Test in 150-nm Technology"; Copyright 2003; Copublished by the IEEE CS and the IEEE CASS; IEEE Design and Test of Computers; pp. 41-45.

Alfred L. Crouch et al.; "AC Scan Path Selection for Physical Debugging"; Copyright 2003; Copublished by the IEEE CS and the IEEE CASS; IEEE Design and Test of Computers; pp. 34-40.

Stephen Pateras; "Achieving At-Speed Structural Test"; Copyright 2003; Copublished by the IEEE CS and the IEEE CASS; IEEE Design and Test of Computers; pp. 26-33.

Xijiang Lin et al.; "High-Frequency, At-Speed Scan Testing"; Copyright 2003; Copublished by the IEEE CS and the IEEE CASS; IEEE Design and Test of Computers; pp. 17-25.

Kee Sup Kim et al.; "Delay Defect Characteristics and Testing Strategies"; Copyright 2003; Copublished by the IEEE CS and the IEEE CASS; IEEE Design and Test of Computers; pp. 8-16.

Kenneth M. Butler et al.; "Guest Editors' Introduction: Speed Test and Speed Binning for Complex ICs"; Copyright 2003; Copublished by the IEEE CS and the IEEE CASS; IEEE Design and Test of Computers; pp. 6-7.

Xilinx, Inc.; "Virtex-II Pro X Platform FPGAs: Complete Data Sheet"; DS110 (v1.1); Advance Product Specification; Mar. 5, 2004; available from Xilinx, Inc., 2100 Logic Drive, San Jose, California, 95124; pp. 185.

Xilinx, Inc.; "PowerPC Processor Reference Guide, Embedded Development Kit"; EDK 6.1 Sep. 2, 2003; available from Xilinx, Inc., 2100 Logic Drive, San Jose, California, 95124; pp. 1-570.

Xilinx, Inc.; "PowerPC 405 Processor Block Reference Guide, Embedded Development Kit"; EDK 6.1 Oct. 6, 2003; available from Xilinx, Inc.; 2100 Logic Drive, San Jose, California, 95124; pp. 1-176.

Xilinx, Inc.; U.S. Appl. No. 10/836,995, filed Apr. 30, 2004 by Ansari et al.

* cited by examiner

SPEED VERIFICATION OF AN EMBEDDED PROCESSOR IN A PROGRAMMABLE LOGIC DEVICE

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

FIELD OF THE INVENTION

One or more aspects of the invention relate generally to speed verification of an embedded processor in an integrated circuit and more particularly, to speed verification of an embedded processor in a programmable logic device for speed binning.

BACKGROUND OF THE INVENTION

Conventionally, testing of integrated circuits involves placing the microchip under test on a device under test ("DUT") card connected to a tester. The tester is used to test the integrated circuit for functionality. In instances where the tester is sufficiently fast, the integrated circuit may be tested at a maximum frequency of operation.

Integrated circuits which are more or less standard products are often speed binned. Examples of such standard products include memories, processors and programmable logic devices, among others. One form of programmable logic device which is a standard product is a Field Programmable Gate Array ("FPGA").

Speed binning an integrated circuit involves testing to determine a frequency, such as the maximum frequency of operation of the integrated circuit, for which it continues to function correctly. Accordingly, some integrated circuits will operate at faster speeds than other same or similarly manufactured integrated circuits whether from same or different production lots. Conventionally, speed binning is used to identify parts that can operate at frequencies in excess of a baseline frequency for sale at a premium price.

The limitation of tester speed is exacerbated by integrated circuits having an embedded processor with frequency of operation significantly faster than a host integrated circuit in which the core is embedded. Another limitation of testers is being able to control, from externally accessible pins of the host integrated circuit, internal pins of the embedded processor, especially when such internal pins significantly out number the externally accessible pins.

Accordingly, it would be desirable and useful to provide means for testing a critical path of an embedded processor in an integrated circuit device with limited, if any, circuitry overhead being added.

SUMMARY OF THE INVENTION

Aspects of the invention generally relate to speed verification of an embedded processor.

An aspect of the invention is a method for speed binning an integrated circuit having an embedded processor, the method comprising: loading predetermined assembly language coded instructions into cache memory of the embedded processor; running the predetermined assembly language coded instructions by the embedded processor to exercise a critical path thereof; and obtaining a test result responsive to running the predetermined assembly language coded instructions to speed bin the integrated circuit.

Another aspect of the invention is a method for generating a test program for an integrated circuit having an embedded processor, the method comprising: obtaining predetermined code to exercise at least one speed limiting path identified; and adding to the predetermined code wrapper code to provide the test program, the wrapper code in part for loading the predetermined code into cache of the embedded processor for testing the at least one speed limiting path of the embedded processor identified.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

An FPGA is an example of an integrated circuit that may be used for implementing one or more aspects of the invention. However, programmable logic devices ("PLDs") other than FPGAs, including complex PLDs ("CPLD") and the like may be used for implementing one or more aspects of the invention. Additionally, other integrated circuits, such as an Application Specific Integrated Circuit ("ASIC"), Application Specific Standard Product ("ASSP"), processors, and the like may have one or more aspects of the invention implemented therein.

Moreover, more than one, including a combination of same or different devices, may be embedded in a host integrated circuit. Accordingly, it should be appreciated that any system on a chip ("SoC"), namely, a host integrated circuit having an embedded processor, may be tested as described herein.

Furthermore, though integrated circuit configurable cells are described for providing circuitry for implementing one or more aspects of the invention, it should be appreciated that dedicated circuitry may be used. Notably, there are many possible exemplary embodiments, and thus for purposes of clarity, what follows is described in terms of a general purpose microprocessor embedded in a host FPGA.

Field Programmable Gate Array

Figure 1:
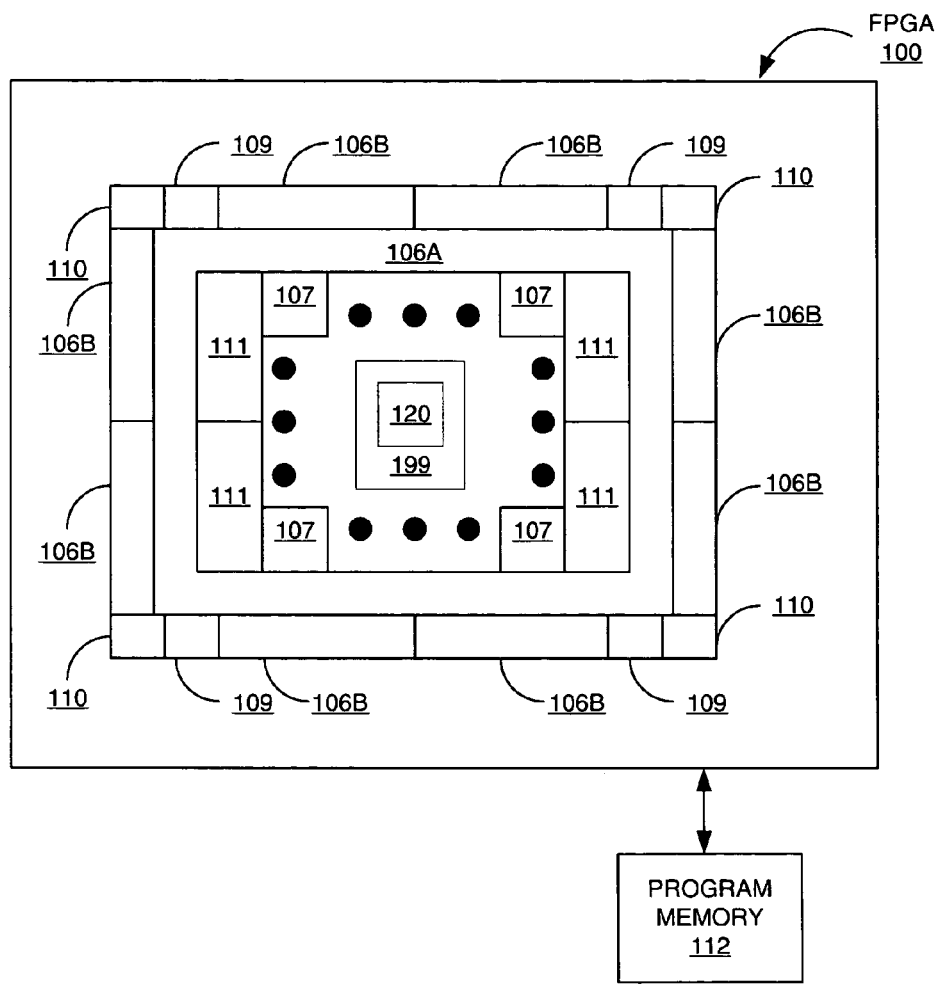
FIG. 1 is a high-level block diagram depicting an exemplary embodiment of an FPGA.

FIG. 1 is a high-level block diagram depicting an exemplary embodiment of an FPGA 100. FPGA 100 includes configurable logic blocks ("CLBs") 107, I/O routing ring 106A, memory, such as random access memory ("RAM") 111, delay lock loops ("DLLs") 109, multiply/divide/deskew clock circuits 110, and programmable input/output blocks ("IOBs") 106B. IOBs 106B may include transceivers, such as multi-gigabit transceivers ("MGTs"). DLLs 109 and clock circuits 110 collectively provide digital clock modules or managers ("DCMs"). Notably, though DLLs are used, it should be appreciated that phase-locked loops ("PLLs"), as well as other known clock generation circuits, may be used.

External memory 112 may be coupled to FPGA 100 to store and provide a configuration bitstream to configure FPGA 100, namely, to program one or more memory cells to configure CLBs 107 and IOBs 106B. FPGA 100 includes an embedded processor 120. Notably, FPGA 100 may include more than one embedded processor 120. Embedded processor 120 is part of processor block 199. To interface embedded processor 120 with FPGA circuitry ("fabric"), processor interface circuitry of processor block 199 may be used, as described below in additional detail.

Though an input/output ring architecture is illustratively shown for FPGA 100, it should be understood that other architectures for FPGA 100, such as a columnar architecture, may be used. Moreover, aspects of the invention are not limited to any particular input/output architecture.

Test System

Figure 2:
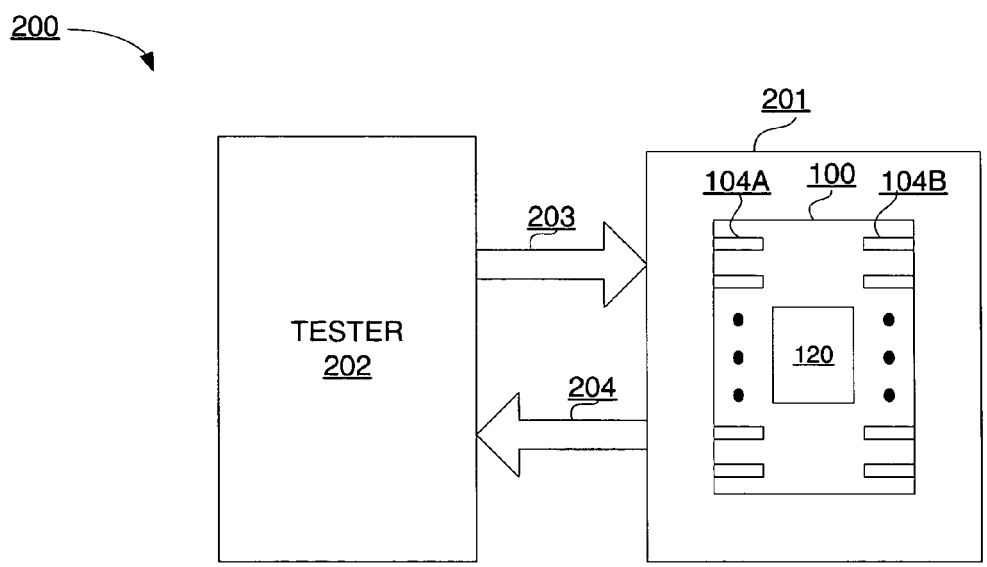
FIG. 2 is a block diagram depicting an exemplary embodiment of a test system.

FIG. 2 is a block diagram depicting an exemplary embodiment of a test system 200. With continuing reference to FIG. 2 and renewed reference to FIG. 1, test system 200 is described.

Test system 200 includes tester 202 and DUT card 201. Test signals 203 are provided to DUT card 201 for pins 104A of FPGA 100. In response to test signals 203, FPGA 100 provides test signals 204 to DUT card 201 via pins 104B of FPGA 100. Notably, an embedded processor 120 may have more input/output ("I/O") pins than the packaged FPGA 100 in which it is embedded, and FPGA 100 may have more I/O pins than tester 202.

FPGA 100 may have a higher frequency of operation than tester 202, and embedded processor 120 may operate a higher frequency of operation than FPGA 100. Thus, integrated circuit 100 may have at least two clock domains, namely, one for FPGA 100 exclusive of embedded processor 120 and one for embedded processor 120. Notably, at least a portion of processor block 199 of FIG. 1 may operate at the same frequency of operation as embedded processor 120.

For speed testing of FPGA 100, it should be understood that a "testbench" includes code written for configuring an FPGA with self-test circuitry from configurable logic. A test routine includes predetermined assembly language coded instructions for exercising a particular path of an embedded processor. Included as part of the test routine is wrapper code, which facilitates executing the predetermined instructions by an embedded processor.

Additionally, because configurable logic may be used to instantiate self-test circuitry, which after testing may be returned to a pool of usable resources, dedicated BIST circuitry may be reduced or avoided. Moreover, a testbench for providing such self-test circuitry is portable among different programmable logic device platforms having an embedded processor.

Operating frequency of an integrated circuit varies with process, voltage and temperature. Thus, it will be appreciated that means described herein may be used for verification of speed of operation, including, but not limited to, maximum speed or above some threshold speed of operation, whether in a standalone environment, connected to a tester (such as automatic test equipment ("ATE")), or undergoing environmental stress testing, or a combination thereof.

Furthermore, it will be appreciated that integrated circuit internal interconnects may be used. If there are differences in I/O pins, namely, where an embedded device has significantly more I/O pins than the device in which it is embedded, then using internal interconnects for testing avoids limitations associated with pin count disparity. For example, embedded processor signals, not otherwise accessible from outside of the SoC, may be controlled or observed using integrated circuit internal interconnects for subsequent output of information indicating performance level test results, such as when operating at a frequency of operation.

Furthermore, ATE may have fewer pin connections than the host integrated circuit, so self-test may be used to simplify the interface between the ATE and the host integrated circuit. Moreover, it will be appreciated that performance may be determined by the integrated circuit ("on-chip") in contrast to having integrated circuit performance determined by an external device ("off-chip"), such as by a tester, where other intervening factors may influence outcome.

Tester 202 provides a source clock signal to FPGA 100, a configuration bitstream to FPGA 100 for instantiating test circuitry, and monitors pass, fail and interrupt signals from such test circuitry, as described below in additional detail. Moreover, tester 202 may be coupled to a microchip handler (not shown) for placing tested FPGAs 100 into respective bins according to speed test results ("speed binning"). It should be understood, that after an FPGA 100 is binned, power is removed from the FPGA. Accordingly, any instantiated circuitry through powered configurable logic is no longer present. This is in contrast to dedicated test circuitry which remains with an integrated circuit. Furthermore, in contrast to conventional built-in self test circuitry, configured-in self test circuitry as described herein may be present only for one or more particular tests being run, and may not be present for all tests. Moreover, in contrast to conventional built-in self test circuitry, which powers up with user usage, configured-in self-test circuitry may not be present for user usage.

Speed Verification

Figure 3:
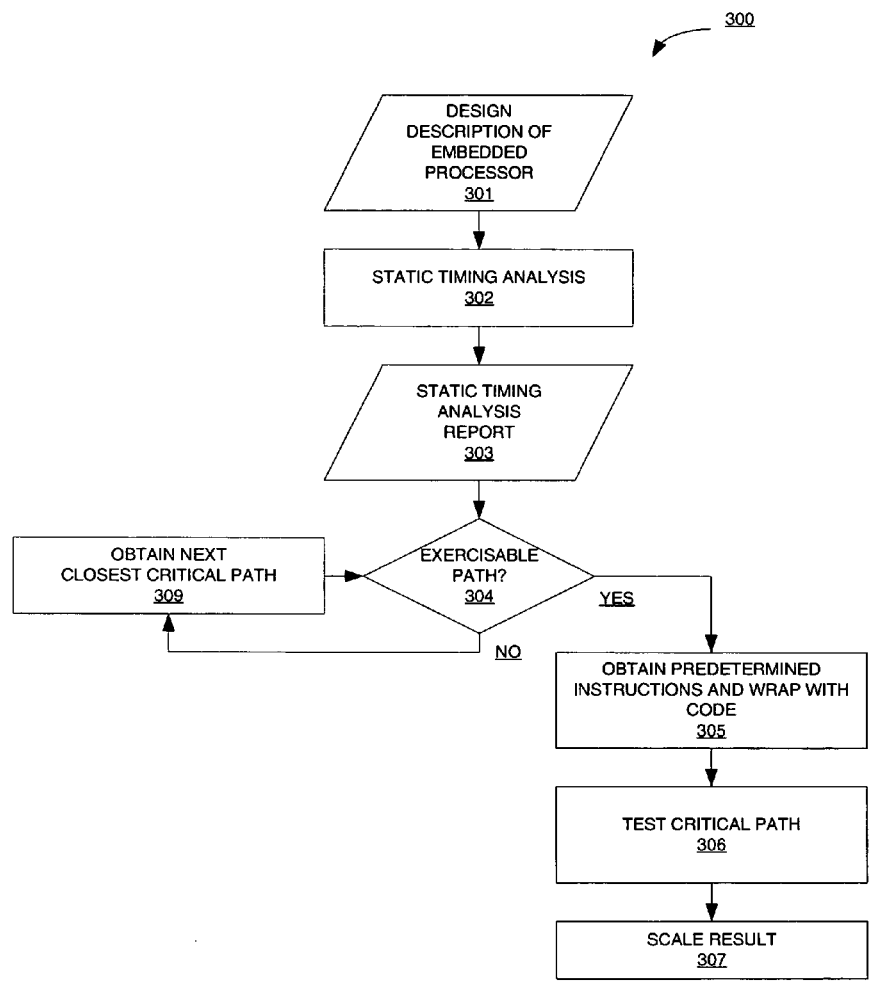
FIG. 3 is a flow diagram depicting an exemplary embodiment of a speed verification flow.

FIG. 3 is a flow diagram depicting an exemplary embodiment of a speed verification flow 300. A design description of an embedded processor ("design description") 301 is obtained. Design description 301 may be in any of a variety of known circuitry simulation languages, conventionally such as gate-level description or Register Transfer Level ("RTL") converted from a Very High Speed Integrated Circuits (VHSIC) Hardware Description Language ("VHDL"), Verilog, C language for hardware description, or the like hardware description language.

Accordingly, the design description may be a netlist, or more particularly a back-annotated netlist. The format of design description 301 is dependent on acceptable input formats to a static timing analysis tool used to perform a static timing analysis at 302. Static timing analysis tools are well known, and thus are not described in detail herein.

Output of static timing analysis at 302 is a static timing analysis report 303. In static timing analysis report 303, at least one "speed limiting path" is reported. A "speed limiting path" includes a path that limits frequency of operation. In other words, a "speed limiting path" is a signal path where propagation delay of a signal traveling thereon imposes an upper limit on frequency of operation for that path. Conventionally, a speed limiting path is the longest path along which a clock-dependent signal travels. The speed limiting path or paths imposing the greatest impact on frequency of operation of an integrated circuit are conventionally referred to as the "critical" path or paths, respectively.

At 304, it is determined whether an identified critical path can be exercised by predetermined assembly language coded instructions. If at 304, an identified critical path cannot be exercised by predetermined assembly language coded instructions running on an embedded microprocessor, a next closest critical path is obtained. The next closest critical path obtained is checked at 304 to determine if it can be exercised by predetermined assembly language coded instructions.

If at 304, an identified critical path can be exercised by predetermined assembly language coded instructions running on an embedded microprocessor, then at 305 such predetermined instructions for exercising such a critical path are obtained. These predetermined instructions are assembly language instructions, which may be run by embedded processor 120. Examples of such predetermined instructions may be found in: "PowerPC Processor Reference Guide: Embedded Development Kit" (EDK 6.1 Sep. 2, 2003) Xilinx, Inc. 2003.

These assembly language predetermined instructions are wrapped in wrapper code at 305. Wrapper code may be used to cause assembly language predetermined instructions for exercising a path, such as a critical path, to be loaded into an embedded processor. Part of the wrapper code identifies where, such as by one or more memory addresses, to obtain such assembly language predetermined instructions, and to write the assembly language predetermined instructions obtained at the address into cache memory of the embedded processor. Assembly language predetermined instructions and wrapper code may be initially written to FPGA internal memory at a specified locations during initial configuration of an FPGA, including configuring an FPGA with self-test circuitry. Alternatively, external memory may be used to store such assembly language predetermined instructions, in which implementation an external address may be specified for obtaining such predetermined instructions.

Figure 6:
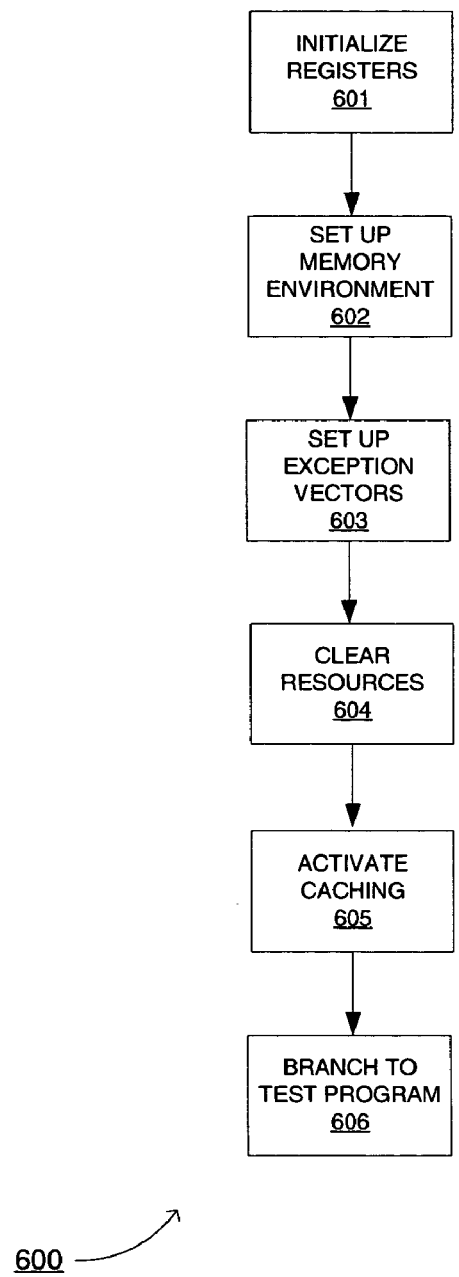
FIG. 6 is a flow diagram for an exemplary embodiment of a processor initialization flow.

FIG. 6 is a flow diagram for an exemplary embodiment of a processor initialization flow 600. Initialization flow 600 is part of wrapper code added at 305 of FIG. 3. Initialization flow 600 sets an embedded processor 120 to a known state in preparation for one or more test programs or routines.

At 601, registers of embedded processor 120 are initialized. At 602, the memory environment is set up. At 603, exception vectors are set up. Exception vectors are initialized with branches to exception handlers. This may include setting an address for an exception vector prefix register.

At 604, embedded processor 120 resources are cleared, such as clearing general purpose registers, fix point exception registers and reservation bit(s). At 605, data and instruction caches are activated. At 606, initialization flow 600 branches ("jumps") to a test program or routine, such as a set of predetermined assembly language instructions for exercising a critical path.

Attached hereto and incorporated by reference herein in its entirety is Appendix A, where there is shown a sample of an embodiment of system initialization code for a PowerPC for embedded processor 120.

Returning to FIG. 3, after 305, a critical path is tested at 306. In a network, there may be multiple paths. Though more than one speed limiting path may be exercised at a time, for purposes of clarity, it will be assumed that only one speed limiting path is being exercised at a time, as it will be readily apparent that more than one speed limiting path may be exercised at a time.

Figure 7:
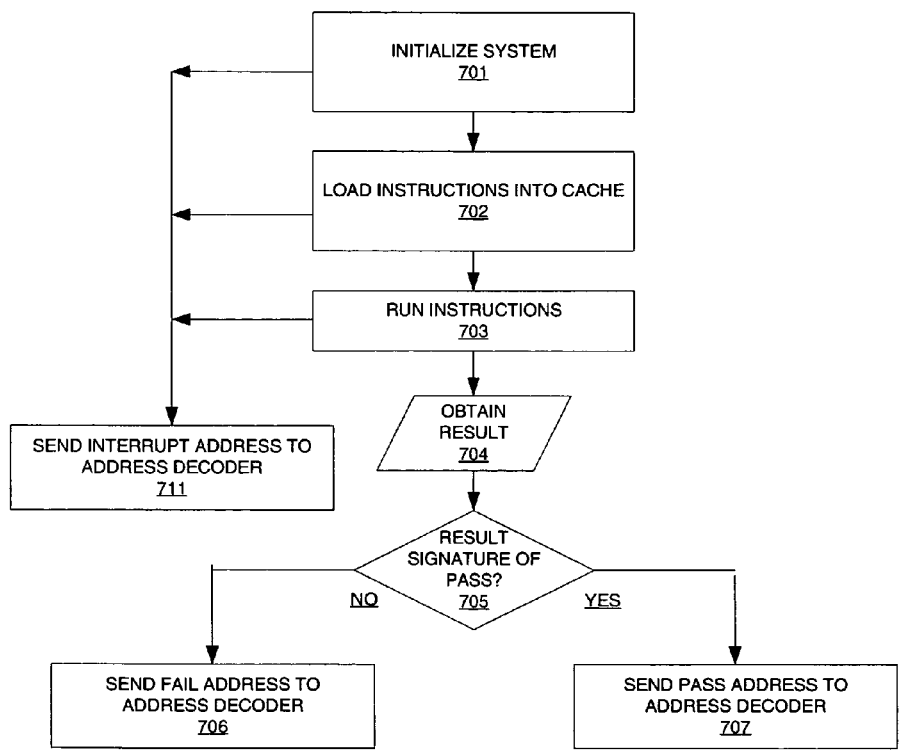
FIG. 7 is a flow diagram depicting an exemplary embodiment of a test sequence for testing a critical path of an embedded processor.

FIG. 7 is a flow diagram depicting an exemplary embodiment of a test sequence 700 for testing a critical path of an embedded processor. At the completion of initialization flow 600, an embedded processor block 199 has been initialized at 701 and initialization flow 600 branches to a test program or routine, which is loaded at 702.

At 702, predetermined assembly language coded instructions are loaded into cache of an embedded processor. Notably, by loading all instructions into cache first, cache misses are avoided. Testing a critical path with a cache miss may invalidate the test.

At 703, such instructions loaded into cache are executed by the embedded processor to exercise an identified critical path within the embedded processor. To know whether a test has run to completion, there is a time limit to execute a set of instructions within one or more clock cycles of a frequency of operation of the embedded processor while executing on a critical path thereof. At the conclusion of the test, i.e., after the time limit is reached, there will be either a pass signature, a fail signature or an interrupt signature. The tester will check which signature has been generated at the conclusion of the test.

For example, a value, such as 5, may be loaded into a register associated with the critical path. Immediately following a load instruction, may be an add instruction, for example, to add 5 to the value of 5 stored in the register. At 704, a result for instructions run at 703 is obtained. At 705, a check is made to determine if the result obtained at 704 is a signature or otherwise indicates a pass of the test. Continuing the above example, if the load and add were done within the time limit, the value in the register and thus the value or signature obtained at 704 would be 10. The result of 10 would indicate a pass signature; however, it the value in the register is some other value, i.e., a failure signature, then that would indicate a failure to complete the operation within the time limit.

If a result obtained at 704 does not indicate a pass at 705, then at 706 a fail address is sent to an address decoder to provide an indication that the frequency of operation for the embedded processor was too high. If a result obtained at 704 does indicate a pass at 705, then at 707 a pass address is sent to an address decoder to provide an indication that the frequency of operation for the embedded processor was not too high.

Notably, with speed binning, there are discrete frequencies at which an embedded processor is tested, starting with the highest of these discrete frequencies. However, the above-described flow may be used for speed characterization of the embedded processor. For speed characterization, a lower frequency of operation is a starting point, and the frequency is gradually increased until the embedded processor fails. Accordingly, speed verification includes speed characterization and speed binning.

Notably, during any of 701, 702 or 703, an interrupt may occur. If an interrupt occurs, then at 711 outcome of a test program is indeterminate ("interrupted"). Accordingly, an interrupt address is sent to an address decoder to indicate the interrupt. This interrupt may be caused by an exception generated by abnormal execution of the program.

Returning to FIG. 3, at 306, an identified critical path is exercised by executing predetermined assembly language coded instructions as described above. If the critical path exercised is not the most critical path or is not sufficiently close to the most critical path in terms of total delay, then the result may be scaled.

At 307, a frequency of operation for a pass result obtained at 306 may be scaled. This scaling may be done for example by multiplying the obtained frequency of operation by a ratio of the worst case delay reported in the static timing analysis and the delay result obtained for the path exercised. However, other implementations for scale may be done. For example, a maximum frequency of operation for a salable part may be divided by a minimum frequency of operation for the salable part to provide max/min frequency ratio. The frequency of operation at which the part passes may be multiplied by the max/min frequency ratio to obtain the frequency of operation of the part.

Additionally, for speed binning embedded processor 120, test instructions may be confined to embedded processor 120, namely, be independent of cycle-to-cycle timing of logic outside of embedded processor 120, to facilitate porting such tests to other embedded processor environments and ensuring validity in such other environments.

Attached hereto and incorporated by reference herein in its entirety is Appendix B, where there is shown a sample of an embodiment of data side speed binning test code for a PowerPC for embedded processor 120. This test uses operand forwarding and thus is named "operandFwd". The operandFwd test is a critical path test of a data side of embedded processor 120, which starts from a data cache array 405 and ends with data in an operand register of embedded processor 120. This test includes use of cache array access, random logic and data path multiplexers; however, cache array access dominates total delay of the critical path tested. Code that targets a critical path is "touched" or otherwise loaded into instruction cache of embedded processor 120. This code in the instruction cache can access data loaded into the data cache of embedded processor 120. This test cause a load that "hits" in the data cache. The data from the load is used by an ADD instruction immediately following the load. These predetermined instructions execute back-to-back without any "bubbles" or other interrupts being inserted. The load data bypasses general purpose registers and is loaded into an operand register. An error condition is promoted when the proper data does not make it into the operand register. Improper data is a result of an incorrect sum from the ADD instruction. A result of the ADD operation is to be stored in a general purpose register. Once an incorrect sum or other error indicator is stored in the general purpose register, the error indicator may be processed to produce a failure signature. This failure signature may be read out from the boundary of embedded processor 120, such as directly via a pin or via a JTAG interface or both.

Attached hereto and incorporated by reference herein in its entirety is Appendix C, where there is shown a sample of an embodiment of instruction side speed binning test code for a PowerPC for embedded processor 120. This test sensitizes a path from an instruction cache tag array to a decode data register, and thus is an instruction fetch ("inst-Fetch") test. This test includes use of cache array access, some random logic and several data path multiplexers; however, cache array access dominates total delay of the critical path tested. Since the instruction fetch to the decode data register cannot be avoided in any code sequence, the setup code for this test is designed to run in a non-cacheable mode. However, when cacheable, this test is designed to cause cache misses that will hit from a fill buffer and not from an instruction cache data array, to provide a greater window for a deterministic failure signature to be obtained. If another memory region were made available, the entire setup may be done from a non-cacheable region. This test configures the instruction cache as follows:

```
A-Side                              B-Side
FFFFFD00  addis r9, 0, 0x5555    FFFFBD00  addis r9, 0, 0xaaaa FFFFBD20  addis r9, 0, 0x5555    FFFFFD20  addis r9, 0, 0x5555
```

The instruction fetch code executes at address FFFFFD00 prefetching into address FFFFD20. The instruction cache output is primed with the instruction at FFFFBD20 and FFFFFD20. An rfi instruction is used to cause the instruction flow to move to FFFFBD00 before any instructions are executed at FFFFFD20. Ultimately, FFFFBD00 should be resolved to a B-Side hit. Initially, instruction addis r9,0, 0x5555 is being steered to decode data registers. As this address resolves, instruction addis r9,0,0xaaaa is steered to the decode data register. Using this setup, an error is isolated to an immediate field of the addis instruction and will be written to a general purpose register. Once in the general purpose register, the error may be processed to provide a failure signature.

Configured Built-in Self-Test

Figure 4:
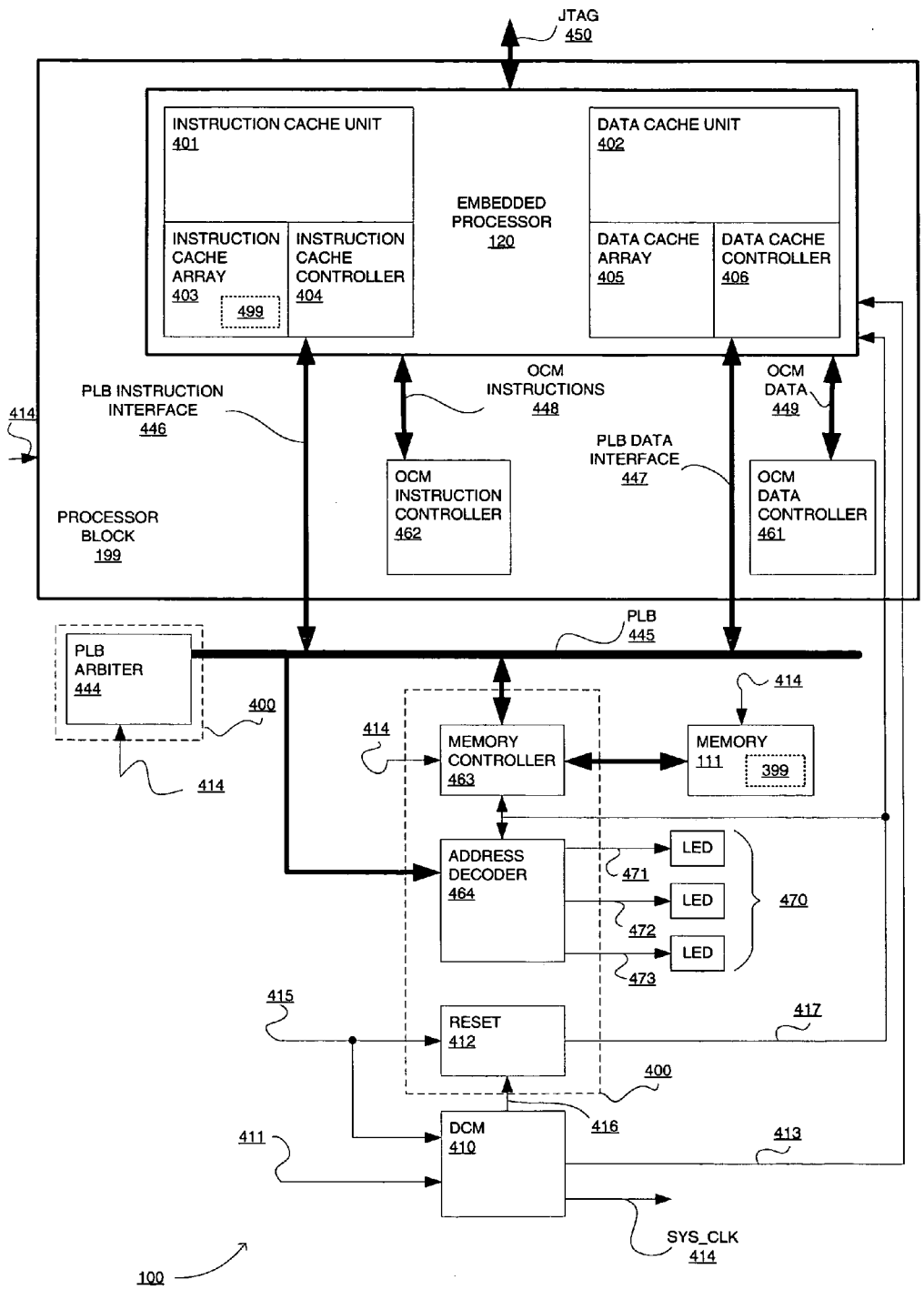
FIG. 4 is a block diagram depicting an exemplary embodiment of an FPGA having configured self-test circuitry.

FIG. 4 is a block diagram depicting an exemplary embodiment of an FPGA having configured-in self-test circuitry 400. An oscillator or clock signal 411 is input to a DCM 410 of FPGA 100. Clock signal 411 may be provided from tester 202 of FIG. 2. Frequency of clock signal 411 may be substantially slower than frequency of operation of embedded processor 120. For example, frequency of clock signal 411 may be approximately 50 MHz and frequency of operation of embedded processor 120 may range from approximately 350 to 450 MHz. Of course other frequencies may be used. Additionally, embedded processor 120 may have a boundary scan interface, such as Joint Task Action Group ("JTAG") interface 450, as is known.

DCM 410 is configurable to adjust frequency of clock signal 411. Thus, for purposes of speed verification, DCM 410 may be used to increase clock frequency in excess of that available from an external source, such as tester 202 of FIG. 2. Furthermore, using an external clock source, such as a crystal ("XCO"), may not be available if I/Os of FPGA 100 are not capable of operating at an upper limit of operational frequency. Because frequency of clock signal 411 is programmably adjustable by using DCM 410, obtaining operational frequencies using on-chip clock generation is facilitated.

DCM 410 multiplies frequency of clock signal 411 to provide a processor clock signal 413. Additionally, DCM 410 may multiply frequency of clock signal 411 to provide a system clock signal 414. System clock signal 414 may be provided to clocked circuits, such as processor local bus ("PLB") arbiter 444, memory controller 463, processor block 199 and memory 111. Notably, conventionally, operation of PLB 445 is synchronized to operation of processor block 199.

Notably, system clock signal 414 may be of a lesser frequency than processor clock signal 413. It is well known that processors conventionally operate at frequencies higher than their local bus and memory. Thus, DCM 410 may use different multiplication ratios for different clock signal outputs. Accordingly, processor clock signal 413 and system clock signal 414 are obtained from a same source clock signal 411, and thus may be provided to embedded processor 120 and PLB arbiter 444 for synchronous operation. It should be appreciated that FPGA 100, exclusive of embedded processor 120, may operate at a different frequency, namely, in a different clock domain, than a frequency of operation of embedded processor 120. Furthermore, it should be appreciated that a tester may not be able to provide a clock signal with a frequency of operation of an embedded processor 120, and thus DCM 410 may be used to multiply up the frequency of the clock signal provided by the tester to one or more frequencies of operation of embedded processor 120.

A reset signal 415 is provided to reset circuitry 412. A lock signal 416 is provided from DCM 410 to reset circuitry 412. Lock signal 416 indicates when DCM 410 has frequency locked to source clock signal 411.

Embedded processor 120 is held in a reset state via reset signal 417 responsive to reset signal 415. However, once DCM 410 obtains a lock, lock signal 416 provided to reset circuitry 412 releases embedded processor 120 from a reset state via reset signal 417 for operation thereof. In other words, embedded processor 120 may automatically begin executing the predetermined instructions in instruction cache responsive to being released from the reset state. Reset signal 417 may be provided to memory controller 463, address decoder 464 and embedded processor 120.

Embedded processor 120 is coupled to PLB arbiter 444 via PLB 445. Memory controller 463 is coupled to embedded processor 120 via PLB 445. Memory 111 is coupled to embedded processor 120 via memory controller 463 and PLB 445.

At least one test program 399 is loaded into memory 111, which is block random access memory ("BRAM") of FPGA 100. Notably, if a test program 399 is too large for internal FPGA memory 111, external memory 112 may be used. Test program 399 includes predetermined assembly language coded instructions for exercising a critical path of embedded processor 120 and includes wrapper code which causes such predetermined instructions to be loaded from memory 111 into cache memory of embedded processor 120. Cache memory of embedded processor 120 may be divided out into instruction cache and data cache. For example, data cache may include a data cache unit 402, data cache array 405 and data cache controller 406, and instruction cache may include an instruction cache unit 401, instruction cache array 403 and instruction cache controller 404.

Instruction cache controller 404 may be coupled to PLB 445 via PLB instruction interface 446. Data cache controller 406 may be coupled to PLB 445 via PLB data interface 447.

Additionally, for managing data and instruction communications from host FPGA 100 to embedded processor 120, on-chip memory ("OCM") controllers may be used. For example, an OCM instruction controller 462, which is coupled to embedded processor 120, may be used for communication of controller instructions 448, instead of using PLB 445 and instruction cache controller 404, and an OCM data controller 461, which is coupled to embedded processor 120, may be used for communication of controller data 449, instead of using PLB 445 and data cache controller 406.

Notably, embedded processor 120, OCM instruction controller 462, OCM data controller 461, PLB 445, and PLB arbiter 444 are all known, and additional details regarding them may be found in: "DS110: 'Virtex-II Pro™ X Platform FPGAs: Functional Description" Datasheet (v1.1; Mar. 4, 2004) Xilinx, Inc., 2004 and in: "PowerPC 405 Processor Block Reference Guide: Embedded Development Kit" (EDK 6.1 Oct. 6, 2003) Xilinx, Inc. 2003.

One or more test programs 399 are provided as processor predetermined instructions to embedded processor 120 and stored in memory 111, and such one or more test programs 399 may be loaded as part of a configuration bitstream for configuring FPGA 100. Accordingly, as a configuration bitstream is used to initialize FPGA, no extra step is used to configure FPGA 100 with one or more test programs 399. In order to operate embedded processor 120 at a frequency of operation thereof, one or more of sets of predetermined test instructions 499 from test programs 399 are loaded into embedded processor 120 cache, such as instruction cache array 403. For example, a test program 399 may include a set of predetermined instructions assembly language instructions and wrapper code. The set of predetermined instructions 499 is for exercising a path, such as a critical path, for purposes of speed verification. The wrapper code is to cause the set of predetermined instructions to be loaded into embedded processor 120 cache, and then after execution of the set of predetermined instruction or a portion thereof, to issue an address signal flag. The set of predetermined instructions 499 stored in embedded processor 120 cache begins being run by embedded processor 120 responsive to embedded processor 120 being released from a reset state, as previously described.

Notably, to operate embedded processor 120 at a frequency of operation, predetermined instructions 499 are stored in an instruction cache of embedded processor 120. The amount of memory of instruction cache array 403 is limited, and conventionally insufficient in size to hold all possible predetermined instruction sequences for testing all circuits of embedded processor 120. Thus, predetermined instructions 499 may just be for exercising a critical path of embedded processor 120.

An address signal flag is sent from embedded processor 120 to PLB arbiter 444. Three addresses may be loaded into PLB arbiter 444, namely, a pass address, a fail address and an interrupt address, as previously described. These addresses may be loaded into PLB arbiter 444 in response to wrapper code, as previously described.

After completion of executing a set of predetermined instructions or after being interrupted during the execution of the set of predetermined instructions for exercising a critical path, embedded processor 120 responsive to wrapper code provides an address flag signal. The address flag signal is provided to PLB arbiter 444 via PLB instruction interface 446. The address flag signal indicates whether embedded processor 120 either passed or failed, or was interrupted during, a speed bin test for example.

Responsive to an address signal flag, PLB arbiter 444 provides one of three addresses to address decoder 454, namely, either a pass address, a fail address or an interrupt address. Address decoder 454 in response to receiving such an address asserts (i.e., driven to an active state) one of three signal, namely, pass signal 471, fail signal 472 and interrupt signal 473.

If pass signal 471 is asserted, then a light emitting diode ("LED") of LEDs 470 associated therewith will illuminate. Notably, LEDs 470 are optional and are not part of FPGA 100. Programmable I/Os may be configured to provide respective output signal paths for signals 471, 472 and 473 as part of configuration of programmed self-test circuitry 400.

It should be appreciated that no extra pins are needed for FPGA 100 self-test circuitry 400. Additionally, the interface between a tester and FPGA 100 is relatively simple, which means that less than full featured test equipment may be used. Moreover, a DUT card or motherboard for testing is simplified.

Self-test circuitry 400 includes address decoder, programmed I/O's for outputting signals 471, 472 and 472, PLB arbiter 444, and reset circuitry 412. Additionally, memory controller 463 may be part of self-test circuitry 400. It should be appreciated that all self-test circuitry 400 programmable resources may be returned to a pool of available resources after testing, and thus there is no lingering overhead with respect to programmable resources post testing. Moreover, all other resources belong to FPGA 100, and thus there is no added permanent overhead in terms of circuitry for self-test as described herein.

Attached hereto and incorporated by reference herein in its entirety is Appendix D, where there is shown a sample of an embodiment of address decoder code for address decoder 464. Address decoder 464 may be implemented in configurable logic using such Verilog code. Implementing other circuits using configurable logic may be done with known libraries. For example, memory controller 463 and PLB arbiter 444 may be implemented with a plb_bram_if_cntrlr and a plb_arbiter, respectively, available from Xilinx, Inc. of San Jose, Calif. Additional details regarding these libraries respectively be may be found in: "PLB Block RAM (BRAM) Interface Controller" Datasheet (DS240; v1.2; Nov. 11, 2002) Xilinx, Inc., 2004; and "Processor Local Bus (PLB) Arbiter Design Specification" Datasheet (Feb. 27, 2002) Xilinx, Inc., 2004.

Configuration of an FPGA for Speed Binning

Figure 5:
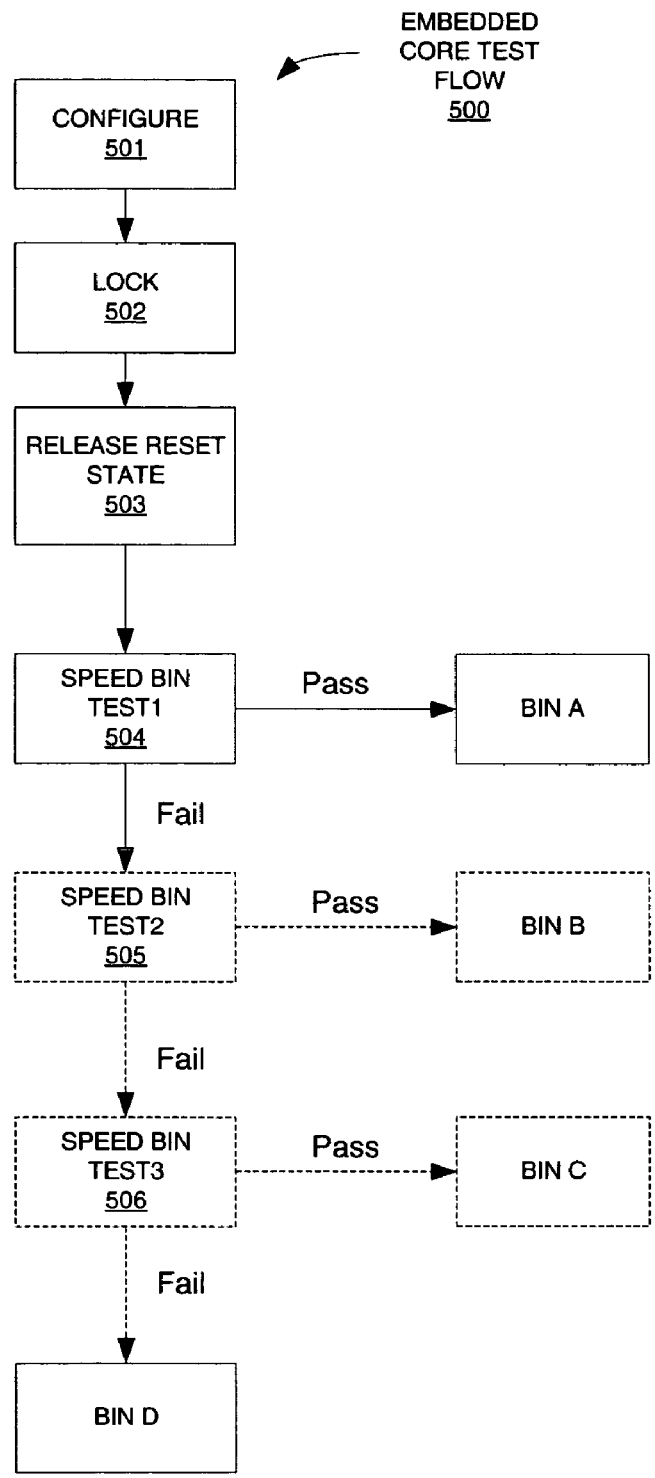
FIG. 5 is a flow diagram depicting an exemplary embodiment of an embedded processor test flow.

FIG. 5 is a flow diagram depicting an exemplary embodiment of an embedded processor test flow 500. With continuing reference to FIG. 5 and renewed reference to FIG. 4, embedded processor test flow 500 is described.

At 501, FPGA 100 is configured with a configuration bitstream. Configuration includes instantiating self-test circuitry 400 in configurable logic and causing one or more test programs 399 to be written into memory 111. At 502, DCM 410 locks onto clock signal 411.

At 503, a reset state of processor block 199 is released responsive to DCM 410 locking to clock signal 411. This automatically causes embedded processor 120 to begin executing a test program 399.

At 504, an embedded processor 120 is tested for speed verification as described with reference to FIGS. 3, 6 and 7. Test outcome from 504 may be used to speed bin FPGA 100 with respect to frequency of operation of embedded processor 120. In one aspect of the present invention, the FPGA 100 may be tested at a first speed bin test 504, for example, 450 MHz, and if it passes the test, then the FPGA is placed in a bin, e.g., Bin A, with an identifier indicating 450 MHz.

At 505, an integrated circuit may be optionally further speed binned at a frequency of operation lower than that at 504. For example, there may be discrete values for speed binning, e.g., 450 MHz, 400 MHz and 350 MHz. Continuing the example, if embedded processor 120 passed a 450 MHz test at 504, then the integrated circuit would be placed in Bin A. If embedded processor 120 failed at 450 MHz, but passed at a 400 MHz test at 505, then the integrated circuit would be placed in another bin, e.g., Bin B. If embedded processor 120 failed at 450 MHz and 400 MHz, but passed at a 350 MHz test at 506, then the integrated circuit would be placed in another bin, e.g., Bin C. If embedded processor 120 failed at 450 MHz, 400 MHz and 350 MHz tests at 504, 505, and 506 respectively, then the integrated circuit would be placed in another bin, e.g., Bin D, as a rejected part. Of course, these frequencies are merely illustrative examples and other discrete frequencies may be used for speed binning. Also the number of tests and bins and the order of steps are also illustrative examples and different numbers of tests and bins and step order may be used for speed binning.

Notably, in addition to using integrated circuit memory, one or more embodiments may be implemented as a program product for use with a computer system such as, for example, the SoC shown in FIG. 1. The program(s) of the program product defines functions of the embodiments and can be contained on a variety of signal/bearing media, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable predetermined instructions that direct the functions of an SoC, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, though assembly language code is described herein, other languages directly executable by a processor may be used. Furthermore, code may be written at a higher level and then translated to a language that may be directly executed by a processor. Claim(s) listing steps do not imply any order of the steps. Trademarks are the property of their respective owners. Headings are used herein merely for purposes of convenience and should not be taken in any way to limit the scope of the invention.

The invention claimed is:

1. A method for generating a test program for a Programmable Logic Device having an embedded processor, the method comprising:
    obtaining predetermined code to internally exercise at least one speed limiting path of the embedded processor identified; and
    adding to the predetermined code wrapper code to provide the test program, the wrapper code in part for loading the predetermined code into cache of the embedded processor for testing the at least one speed limiting path of the embedded processor identified;
    wherein the wrapper code identifies at least one location in memory from which the predetermined code is obtained and wherein the adding results in the test program to be implemented in the Programmable Logic Device.

2. The method, as in claim 1, further comprising:
obtaining a timing annotated design description of the embedded processor;
performing a static timing analysis using the timing annotated design description; and
identifying the at least one speed limiting path in the embedded processor from an outcome of the static timing analysis.

3. The method, as in claim 1, wherein the speed limiting path is a critical path having the greatest impact on operational frequency of the embedded processor.

4. The method, as in claim 1, wherein the speed limiting path is a critical path not having the greatest impact on operation frequency of the embedded processor.

5. The method, as in claim 4, wherein the predetermined code is for testing the critical path, the method further comprising:
executing the predetermined code with the embedded processor to exercise the critical path of the embedded processor to obtain a test result; and
scaling the test result to determine a frequency of operation of the embedded processor.

6. The method, as in claim 5, further comprising speed binning the Programmable Logic Device responsive to the frequency of operation.

7. The method, as in claim 1, wherein the programmable logic device is a Field Programmable Gate Array.

8. The method, as in claim 1, wherein the embedded processor comprises an instruction cache, the method further comprising loading the predetermined code into the instruction cache, wherein the wrapper code and the predetermined code are in an assembly language for execution by the embedded processor.

9. The method, as in claim 8, wherein the wrapper code is configured to load into the instruction cache the predetermined code from the memory, the memory being internal memory of the programmable logic device.

10. The method, as in claim 8, wherein the wrapper code is configured to load into the instruction cache the predetermined code from the memory, the memory being external memory coupled to the programmable logic device.

11. The method, as in claim 1, wherein the wrapper code is configured to provide an address responsive to execution outcome of the predetermined code by the embedded processor.

12. The method, as in claim 11, wherein the address indicates a failure to execute the predetermined code at a frequency of operation.

13. The method, as in claim 11, wherein the address indicates the predetermined code was executed at a frequency of operation.

14. The method, as in claim 11, wherein the address indicates the predetermined code was interrupted during execution thereof.

15. The method, as in claim 1, wherein the predetermined code is configured to test an instruction side of the embedded processor.

16. The method, as in claim 1, wherein the predetermined code is configured to test a data side of the embedded processor.

17. The method, as in claim 16, wherein the predetermined code uses operand forwarding to test the data side of the embedded processor.

18. A method for speed binning a programmable logic device having an embedded processor, the method comprising:
using wrapper code for identification of location of predetermined code to load into cache memory of the embedded processor;
loading predetermined assembly language coded instructions of the predetermined code into the cache memory of the embedded processor;
running the predetermined assembly language coded instructions by the embedded processor to internally exercise a critical path thereof; and
obtaining a test result responsive to running the predetermined assembly language coded instructions to speed bin the programmable logic device.

19. The method, according to claim 18, further comprising speed binning the programmable logic device responsive to the test result.

20. A computer-readable storage medium containing a program which, when executed by an embedded processor in a programmable logic device, causes execution of a method comprising:
using wrapper code for identification of location of predetermined code to load into cache memory of the embedded processor;
loading predetermined assembly language coded instructions of the predetermined code into the cache memory of the embedded processor;
running the predetermined assembly language coded instructions by the embedded processor to internally exercise a critical path thereof; and
obtaining a test result responsive to running the predetermined assembly language coded instructions to speed bin the programmable logic device.

21. The signal-bearing medium, according to claim 20, wherein the method further comprises speed binning the programmable logic device responsive to the test result.

22. A method for speed binning a programmable logic device having an embedded processor, comprising:
using wrapper code for identification of location of test code to load into cache of the embedded processor;
obtaining test code to exercise a critical path of the embedded processor, the test code including predetermined code for exercising the critical path when executed by the embedded processor;
loading the test code into the cache of the embedded processor for testing the critical path of the embedded processor, wherein the test code is in an assembly language for execution by the embedded processor;
executing the test code with the embedded processor to internally exercise the critical path of the embedded processor to obtain a test result indicative of a frequency of operation of the embedded processor; and
speed binning the programmable logic device responsive to the frequency of operation.

23. The method, according to claim 22, further comprising scaling the test result to determine the frequency of operation of the embedded processor.

* * * * *